(12) United States Patent
Kim et al.

(10) Patent No.: US 8,536,772 B2
(45) Date of Patent: Sep. 17, 2013

(54) OLED TILE FOR ILLUMINATION

(75) Inventors: Sun Young Kim, Daejeon-si (KR); Yong Sun Choi, Daejeon-si (KR)

(73) Assignee: Silicon Works Co., Ltd., Daejeon-Si (KR)

( * ) Notice: Subject to any disclaimer, the term of this patent is extended or adjusted under 35 U.S.C. 154(b) by 0 days.

(21) Appl. No.: 13/597,065

(22) Filed: Aug. 28, 2012

(65) Prior Publication Data
US 2013/0049567 A1    Feb. 28, 2013

(30) Foreign Application Priority Data

Aug. 30, 2011 (KR) .................. 10-2011-0087205

(51) Int. Cl.
*H01L 51/50* (2006.01)
*F21V 21/00* (2006.01)

(52) U.S. Cl.
USPC ...... 313/153; 313/512; 362/398; 362/249.02; 362/612; 362/800

(58) Field of Classification Search
None
See application file for complete search history.

(56) References Cited

U.S. PATENT DOCUMENTS

| 2010/0076527 A1* | 3/2010 | Hammond et al. ............. 607/88 |
| 2012/0091923 A1* | 4/2012 | Kastner-Jung et al. ....... 315/360 |

FOREIGN PATENT DOCUMENTS

| DE | 20 2009 013 348 | 1/2010 |
| JP | 2005-19395 | 1/2005 |
| JP | 2006-164827 | 6/2006 |
| WO | 2010/022102 | 2/2010 |
| WO | 2010/116301 | 10/2010 |
| WO | 2010/135036 | 11/2010 |

* cited by examiner

*Primary Examiner* — Ashok Patel
(74) *Attorney, Agent, or Firm* — Kile Park Reed & Houtteman PLLC

(57) ABSTRACT

An organic light emitting diode (OLED) tile device for illumination includes: a rear surface cover having a plurality of conductive rear surface cover magnets which are electrically connected to an anode layer and a cathode layer of an OLED tile for illumination and pass a current to the OLED tile, and coupled to a rear surface of the OLED tile; and a front surface cover having a plurality of front surface cover magnets and integrally coupled to the rear surface cover and the OLED tile for illumination.

13 Claims, 4 Drawing Sheets

OLED TILE FOR ILLUMINATION

FIELD OF THE INVENTION

The present invention relates to an OLED (organic light emitting diode) tile device for illumination, and more particularly, to an OLED tile device for illumination, which contacts electrodes of an OLED tile with conductive magnets provided on tile covers for supporting the OLED tile, thereby operating the OLED tile using power transferred to the conductive magnets transferred from an external driver.

DESCRIPTION OF THE RELATED ART

In general, an OLED refers to a light emitting device which includes an organic light emitting layer stacked between an anode layer and a cathode layer over a substrate and emits high-brightness light through low-voltage DC driving. The organic light emitting layer may include an organic field-effect thin film.

The OLED may be driven at a low voltage, may be bent, and has a small thickness. Furthermore, since the OLED has a wide viewing angle and a high response speed, the OLED may solve the problems of the conventional LCD (liquid crystal display). Furthermore, since the OLED may be fabricated by a simple fabrication process, much attention is being paid to the OLED as a next-generation flat display and light source.

FIG. 1 is a diagram illustrating a conventional OLED tile for illumination.

Referring to FIG. 1, the conventional OLED tile for illumination includes a substrate 110, a transparent electrode layer 120, an anode layer 130, an organic light emitting layer 140, a cathode layer 150, and an encapsulation unit 160.

Since the functions and operations of the respective components of the conventional OLED tile are already well-known to those skilled in the art, the detailed descriptions thereof are omitted herein.

The OLED tile for illumination has front and rear surfaces fixed by a tile cover. As a driver for driving the OLED tile is connected to the tile cover, the OLED tile for illumination is used as an illumination device.

However, the illumination device using the conventional OLED tile for illumination has a problem in that, when a plurality of OLED tiles for illumination are connected, electric wires for supplying power to the respective OLED tiles must be connected to drive the respective OLED tiles, and thus the electric wiring becomes complex.

Furthermore, when an OLED tile for illumination, connected to the illumination device, has something wrong and is to be replaced, a metallic wire connected to the abnormal OLED tile must be removed and reconnected to an OLED tile which operates normally. Therefore, there are difficulties in managing and repairing the illumination device.

SUMMARY OF THE INVENTION

Accordingly, the present invention has been made in an effort to solve the problems occurring in the related art, and an object of the present invention is to provide an OLED tile device for illumination, which contacts electrodes of an OLED tile with conductive magnets provided on tile covers for supporting the OLED tile, thereby operating the OLED tile using power transferred to the conductive magnets from an external driver.

In order to achieve the above object, according to one aspect of the present invention, there is provided an OLED tile device for illumination, including: a rear surface cover having a plurality of conductive rear surface cover magnets which are electrically connected to an anode layer and a cathode layer of an OLED tile for illumination and pass a current to the OLED tile, and coupled to a rear surface of the OLED tile; and a front surface cover having a plurality of front surface cover magnets and integrally coupled to the rear surface cover and the OLED tile for illumination.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
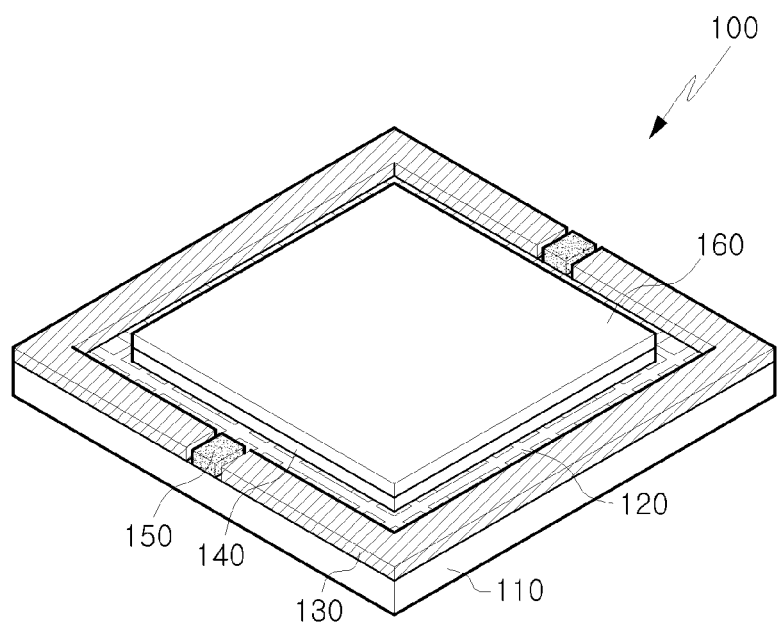
FIG. 1 is a diagram illustrating a conventional OLED tile for illumination.

Reference will now be made in greater detail to a preferred embodiment of the invention, an example of which is illustrated in the accompanying drawings. Wherever possible, the same reference numerals will be used throughout the drawings and the description to refer to the same or like parts.

The core idea of the present invention is to contact electrodes of an OLED tile for illumination with magnets provided on tile covers for supporting the OLED tile, thereby operating the OLED tile using power transferred from outside.

Figure 2:
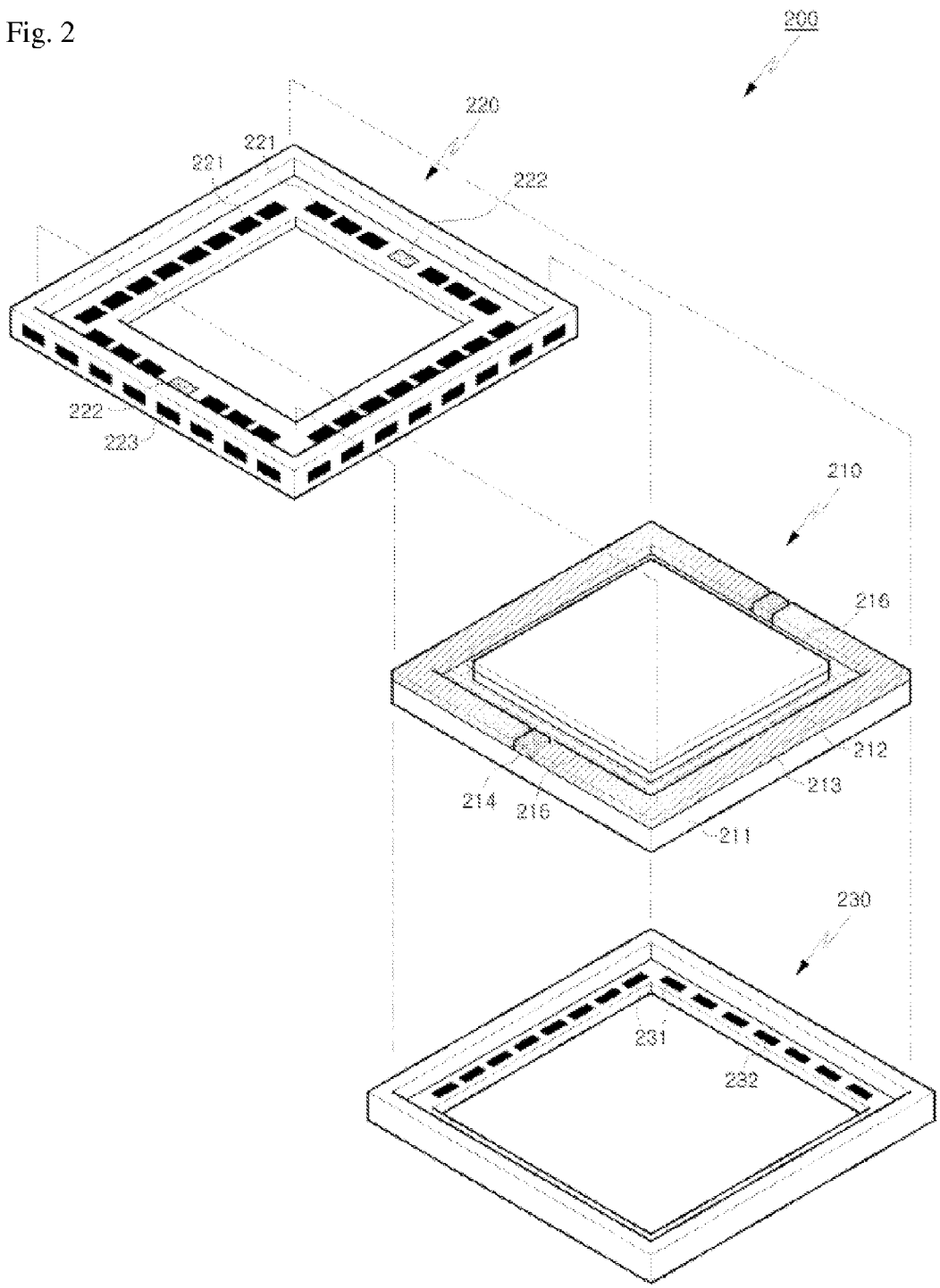
FIG. 2 is an exploded perspective view of an OLED tile for illumination according to an embodiment of the present invention.

FIG. 2 is an exploded perspective view of an OLED tile for illumination according to an embodiment of the present invention.

Referring to FIG. 2, the OLE tile device for illumination according to the embodiment of the present invention includes an OLED tile 210 for illumination, a rear surface cover 220, and a front surface cover 230.

The OLED tile 210 for illumination includes a transparent electrode layer 212, an anode layer 213, a cathode layer 214, an organic light emitting layer 215, and an encapsulation unit 216, which are formed over a substrate 211. Since the detailed configurations, functions, and operations of the respective components are the same as described with reference to FIG. 1, the detailed descriptions are omitted here.

The rear surface cover 220 includes a plurality of first rear surface cover magnets 221 contacted with the anode layer 213 of the OLED tile 210, a second rear surface cover magnet 222 contacted with the cathode layer 214 of the OLED tile 210, and a plurality of third rear surface cover magnets 223 formed on side surfaces thereof.

The first and second rear surface cover magnets 221 and 222 are connected to electric wires to pass a current to the anode layer 213 and the cathode layer 214 of the OLED tile 210.

That is, the rear cover 220 transfers power, transferred from an external driver (not illustrated) to the first and second rear surface cover magnets 221 and 222, to the anode layer 213 and the cathode layer 214 of the OLED tile 210.

Meanwhile, the front surface cover 230 includes a plurality of first front surface cover magnets 231 provided at positions corresponding to the respective first rear surface cover magnets 221 of the rear surface cover 220 and a of second front surface cover magnet 232 provided at a position corresponding to the second rear surface cover magnet 232.

Since the first and second front surface cover magnets 231 and 232 have a different polarity from the first and second rear surface cover magnets 221 and 222, the anode layer 213 and the cathode layer 214 of the OLED tile 210 may be smoothly contacted with the first and second rear surface cover magnets 221 and 222.

FIG. 2 illustrates that the plurality of first rear surface cover magnets 221 are formed separately from each other. However, the plurality of first rear surface covers magnets 221 may be integrated with each other, if necessary.

Figure 3:
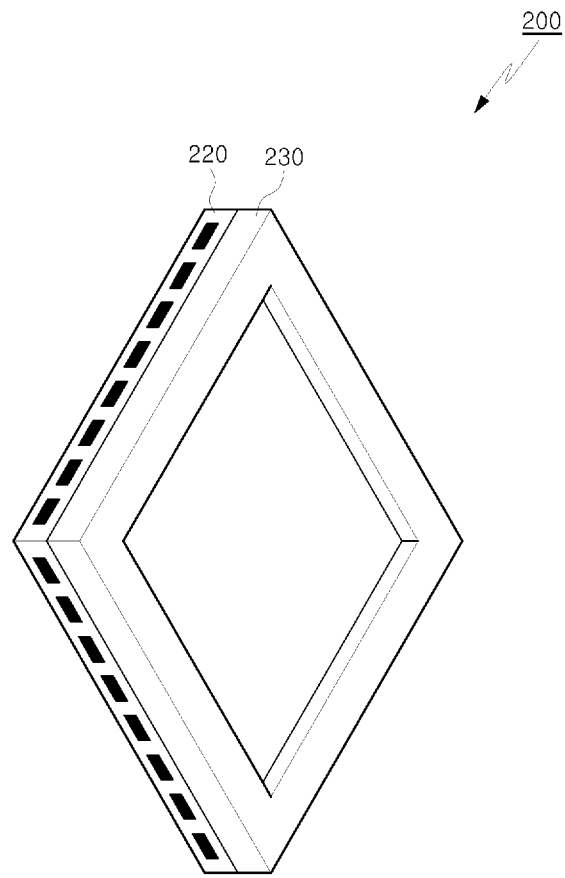
FIG. 3 is an assembled perspective view of the OLED tile device for illumination according to the embodiment of the present invention.

FIG. 3 is an assembled perspective view of the OLED tile device for illumination according to the embodiment of the present invention.

Referring to FIGS. 2 and 3, the OLED tile device 200 for illumination according to the embodiment of the present invention operates as follows: when power is supplied to the first and second rear surface cover magnets 221 and 222 from the external driver (not illustrated), a current is passed to the anode layer 213 and the cathode layer 214 of the OLED tile 210 for illumination, which are contacted with the first and second rear surface cover magnets 221 and 222, and the OLED tile 210 emits light.

Figure 4:
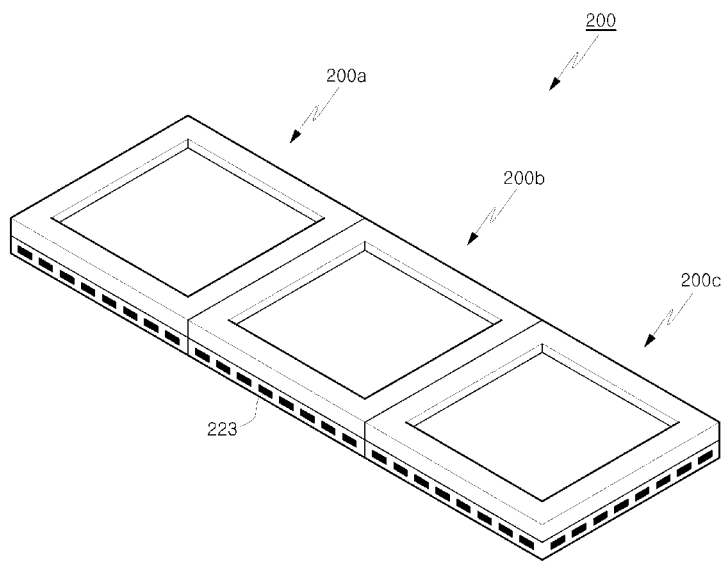
FIGS. 4 and 5 are assembled perspective views of the OLED tile devices for illumination according to the embodiment of the present invention.
Figure 5:
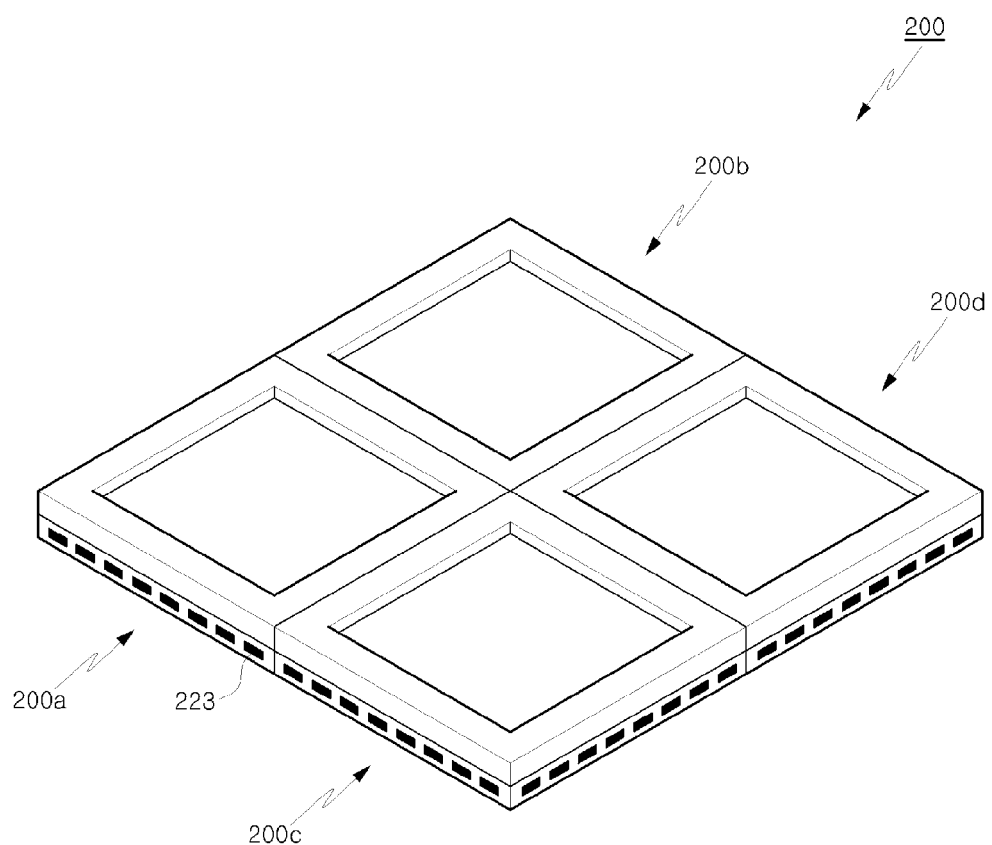

FIGS. 4 and 5 are assembled perspective views of the OLED tile devices for illumination according to the embodiment of the present invention.

Referring to FIGS. 4 and 5, it can be seen that the plurality of OLED tile devices 200 illustrated in FIG. 3 are connected to each other.

At this time, the respective OLED tile devices 200a, 220b, 200c, and 200d are connected to each other through the third rear surface cover magnets 223 formed on the side surfaces thereof. When power is supplied to any one of the OLED tile devices, for example, the OLED tile device 200a, a current is passed to the electrodes of all the OLED tile devices 200a to 220d to emit light, even though power is not supplied to the other OLED tile devices 200b to 220d adjacent to the OLED tile device.

Therefore, since all of the OLED tile devices do not need to be connected to electric wires, it is possible to reduce the number of electric wires required for the OLED tile devices.

Furthermore, when any one of the OLED tile devices, for example, the OLED tile device 200b has something wrong, only the OLED tile device 200b may be easily replaced because the OLED tile device 200b is not connected to the adjacent OLED tile devices 200a, 200c, and 200d through electric wires. Therefore, the OLED tile devices for illumination may be easily managed and repaired.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. An organic light emitting diode (OLED) tile device for illumination, comprising:
   a rear surface cover having a plurality of conductive rear surface cover magnets which are electrically connected to an anode layer and a cathode layer of an OLED tile for illumination and pass a current to the OLED tile, and coupled to a rear surface of the OLED tile; and
   a front surface cover having a plurality of front surface cover magnets and integrally coupled to the rear surface cover and the OLED tile for illumination.

2. The OLED tile device of claim 1, wherein the rear surface cover magnets comprise:
   a first rear surface cover magnet contacted with the anode layer;
   a second rear surface cover magnet contacted with the cathode layer; and
   a third rear surface cover magnet formed on a side surface of the rear cover.

3. The OLED tile device of claim 2, wherein the front surface cover magnets comprise:
   a first front surface cover magnet formed at a position corresponding to the first rear surface cover magnet with the anode layer interposed therebetween; and
   a second front surface cover magnet formed at a position corresponding to the second rear surface cover magnet with the cathode layer interposed therebetween.

4. The OLED tile device of claim 3, wherein the front surface cover magnets have an opposite polarity to the rear surface cover magnets.

5. An OLED tile device for illumination, comprising two or more OLED tile devices of claim 2, which are arranged adjacent to each other.

6. The OLED tile device of claim 5, wherein power is supplied to any one of the two or more OLED tile devices arranged adjacent to each other from an external driver.

7. The OLED tile device of claim 6, wherein the power supplied to the OLED tile device from the driver is transferred to an adjacent OLED tile device through the third rear surface cover magnet.

8. An OLED tile device for illumination, comprising two or more OLED tile devices of claim 3, which are arranged adjacent to each other.

9. The OLED tile device of claim 8, wherein power is supplied to any one of the two or more OLED tile devices arranged adjacent to each other from an external driver.

10. The OLED tile device of claim 9, wherein the power supplied to the OLED tile device from the driver is transferred to an adjacent OLED tile device through the third rear surface cover magnet.

11. An OLED tile device for illumination, comprising two or more OLED tile devices of claim 4, which are arranged adjacent to each other.

12. The OLED tile device of claim 11, wherein power is supplied to any one of the two or more OLED tile devices arranged adjacent to each other from an external driver.

13. The OLED tile device of claim 12, wherein the power supplied to the OLED tile device from the driver is transferred to an adjacent OLED tile device through the third rear surface cover magnet.

* * * * *